US008183596B2

(12) United States Patent
Ueno et al.

(10) Patent No.: US 8,183,596 B2
(45) Date of Patent: May 22, 2012

(54) HIGH ELECTRON MOBILITY TRANSISTOR, EPITAXIAL WAFER, AND METHOD OF FABRICATING HIGH ELECTRON MOBILITY TRANSISTOR

(75) Inventors: Masaki Ueno, Itami (JP); Takashi Kyono, Itami (JP); Yohei Enya, Itami (JP); Takamichi Sumitomo, Itami (JP); Yusuke Yoshizumi, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 123 days.

(21) Appl. No.: 12/846,311

(22) Filed: Jul. 29, 2010

(65) Prior Publication Data

US 2011/0210378 A1    Sep. 1, 2011

(30) Foreign Application Priority Data

Sep. 30, 2009  (JP) ................. P2009-228633

(51) Int. Cl.
*H01L 21/02* (2006.01)
*H01L 21/338* (2006.01)
*H01L 31/06* (2012.01)

(52) U.S. Cl. ......... 257/194; 257/E29.246; 257/E21.403; 438/172

(58) Field of Classification Search ........... 257/194, 257/201, E29.246, E29.091, E21.403; 438/172, 438/167, 285
See application file for complete search history.

(56) References Cited

U.S. PATENT DOCUMENTS

2007/0290228 A1* 12/2007 Yoshida .................. 257/190
2008/0283870 A1* 11/2008 Sato ....................... 257/194
2009/0114943 A1*  5/2009 Fujikura .................. 257/103

FOREIGN PATENT DOCUMENTS

JP  2005-033073 A2  2/2005
JP  2008-311533 A2  12/2008

OTHER PUBLICATIONS

Takeuchi et al., "Theoretical Study of Orientation Dependence of Piezoelectric Effects in Wurtzite Strained GaInN/GaN Heterostructures and Quantum Wells," Japanese Journal of Applied Physics, vol. 39, Part 1, No. 2A, pp. 413-416 (2000).

* cited by examiner

*Primary Examiner* — Thomas L Dickey
*Assistant Examiner* — Nikolay Yushin
(74) *Attorney, Agent, or Firm* — Venable LLP; Michael A. Sartori (57) ABSTRACT

A high electron mobility transistor includes a free-standing supporting base having a III nitride region, a first III nitride barrier layer which is provided on the first III nitride barrier layer, a III nitride channel layer which is provided on the first III nitride barrier layer and forms a first heterojunction with the first III nitride barrier layer, a gate electrode provided on the III nitride channel layer so as to exert an electric field on the first heterojunction, a source electrode on the III nitride channel layer and the first III nitride barrier, and a drain electrode on the III nitride channel layer and the first III nitride barrier. The III nitride channel layer has compressive internal strain, and the piezoelectric field of the III nitride channel layer is oriented in the direction from the supporting base towards the first III nitride barrier layer. The first heterojunction extends along a plane having a normal axis that is inclined at an inclination angle in the range of 40 degrees to 85 degrees or 140 degrees to 180 degrees with respect to the c-axis of the III nitride region.

26 Claims, 7 Drawing Sheets

HIGH ELECTRON MOBILITY TRANSISTOR, EPITAXIAL WAFER, AND METHOD OF FABRICATING HIGH ELECTRON MOBILITY TRANSISTOR

BACKGROUND OF THE INVENTION

1. Field of the Invention

The present invention relates to a high electron mobility transistor, an epitaxial wafer, and a method of fabricating the high electron mobility transistor.

2. Related Background Art

Patent Literature 1 discloses a transistor having an annular gate electrode. An undoped AlN layer (50 nm thick), undoped GaN (1 µm thick) layer, and undoped $Al_{0.2}Ga_{0.8}N$ layer (25 nm thick) are sequentially grown on a sapphire substrate by molecular beam epitaxy.

Patent Literature 2 discloses a transistor having normally-off characteristics. The transistor has a GaN-based semiconductor layer grown on a GaN-based single crystal substrate. The GaN-based single crystal substrate constitutes an electron channel layer while the GaN-based semiconductor layer constitutes an electron supply layer. A primary growth surface of the GaN-based single crystal substrate is m-plane, and a primary growth plane of the GaN-based semiconductor layer formed on the GaN-based single-crystal substrate is also the m-plane. The m-plane (nonpolar plane) produces no piezoelectric field, leading to suppression of creation of a two-dimensional electron gas layer at the heterojunction when no gate voltage is applied.

Non-patent Literature 1 discloses an estimation of piezoelectric field.

Patent Literature 1: Japanese Patent Application Laid-Open No. 2005-033073
Patent Literature 2: Japanese Patent Application Laid-Open No. 2008-311533
Non-patent Literature 1: JJAP, vol. 39, 413, (2000)

SUMMARY OF THE INVENTION

A nitride-based high electron mobility transistor (HEMT) on the c-plane utilizes two-dimensional electron gas generated at its channel by a positive piezoelectric field.

This piezoelectric field causes the transistor to have normally-on characteristics. The sheet carrier concentration of the transistor is very large, and provides the transistor with a low on-resistance.

The nitride-based high electron mobility transistor (HEMT) on the m-plane does not create any piezoelectric field, resulting in no generation of two-dimensional electron gas when a gate voltage is zero volts. Although the transistor exhibits normally-off characteristics, the sheet carrier concentration is not enhanced by piezoelectric field because of no piezoelectric field.

An object of the invention, which has been accomplished in consideration of the above background, is to provide a high electron mobility transistor that exhibits normally-off characteristics, to provide an epitaxial wafer for this high electron mobility transistor, and to provide a method of fabricating a high electron mobility transistor.

A high electron mobility transistor according to one aspect of the present invention includes: (a) a free-standing supporting base having a III nitride region; (b) a first III nitride barrier layer on the III nitride semiconductor region; (c) a III nitride channel layer provided on the first III nitride barrier layer, the III nitride channel layer forming a first heterojunction with the first III nitride barrier layer; (d) a gate electrode provided on the III nitride channel layer so as to exert an electric field on the first heterojunction; (e) a source electrode provided on the III nitride channel layer and the first III nitride barrier layer; and (f) a drain electrode provided on the III nitride channel layer and the first III nitride barrier. The III nitride channel layer has compressive internal strain such that a piezoelectric field in the III nitride channel layer is oriented in a direction from the supporting base toward the first III nitride barrier layer, and the first heterojunction extends along a plane which has a normal axis is inclined at an inclination angle in a range of 40 degrees to 85 degrees or 140 degrees to 180 degrees with respect to a c-axis of the III nitride region.

In the high electron mobility transistor, the III nitride channel layer is provided on the first III nitride barrier layer and forms the first heterojunction with the first III nitride barrier layer. When the first heterojunction extends along a plane having a normal axis that is inclined at an inclination angle in the range of 40 degrees to 85 degrees or 140 degrees to 180 degrees with respect to the c-axis of the III nitride region, the III nitride channel layer incorporates compressive strain, so that the piezoelectric field of the III nitride channel layer is oriented in the direction from the substrate towards the first III nitride barrier layer. In the inclination angle within the above-described ranges, the amplitude of the piezoelectric field of the III nitride channel layer below the gate electrode is lower than that that of a channel layer on the c-plane, leading to realization of the normally-off characteristics with a non-zero amplitude of the piezoelectric field remained.

The high electron mobility transistor according to one aspect of the present invention may include a second III nitride barrier layer between the gate electrode and the III nitride channel layer. The second III nitride barrier layer may form a second heterojunction with the III nitride channel layer, and the second heterojunction extends along a plane having a normal axis that is inclined at an inclination angle in the range of 40 degrees to 85 degrees or 140 degrees to 180 degrees with respect to the c-axis of the first III nitride barrier layer.

In the high electron mobility transistor, the second III nitride barrier layer forms the second heterojunction with a second plane of the III nitride channel layer, which allows the second heterojunction to function as a channel. Hence, an epitaxial wafer for a transistor of a dual channel structure is provided.

In the aspect of the present invention, the second III nitride barrier layer may be doped with an n type dopant. According to the present invention, carriers from the second III nitride barrier layer are supplied to the channel formed in the vicinity of the interface between the second III nitride barrier layer and the channel layer.

In the above aspect of the present invention, the gate electrode can form a Schottky junction with the second III nitride barrier layer. This aspect of the present invention can provide a dual-channel transistor exhibiting normally-off characteristics.

An epitaxial wafer for a high electron mobility transistor according to another aspect of the present invention includes: (a) a free-standing substrate having a III nitride region; (b) a first III nitride barrier layer provided on the III nitride semiconductor region; and (c) a III nitride channel layer provided on the first III nitride barrier layer. A first surface of the III nitride channel layer forms a first heterojunction with the first III nitride barrier layer. The III nitride channel layer includes compressive internal strain such that a piezoelectric field of the III nitride channel layer is oriented in a direction substrate towards the first III nitride barrier layer. A primary surface of the supporting base extends along a plane having a normal axis inclined at an inclination angle in a range of 40 degrees to 85 degrees or 140 degrees to 180 degrees with respect to a c-axis of the first III nitride barrier layer. The first heterojunction extends along a plane having a normal axis inclined at an inclination angle in a range of 40 degrees to 85 degrees or 140 degrees to 180 degrees with respect to a c-axis of the III nitride region. A second surface of the III nitride channel layer extends along a plane having a normal axis inclined at an inclination angle in a range of 40 degrees to 85 degrees or 140 degrees to 180 degrees with respect to a c-axis of the first III nitride barrier layer, and the second surface of the III nitride channel layer is opposite to the first surface of the III nitride channel layer.

In this epitaxial wafer, the III nitride channel layer is provided on the first III nitride barrier layer and forms the first heterojunction with the first III nitride barrier layer. The III nitride channel layer incorporates compressive strain, and the piezoelectric field of the III nitride channel layer is oriented in the direction from the substrate toward the first III nitride barrier layer. The first heterojunction extends along a plane having a normal axis that is inclined at an inclination angle in the range of 40 degrees to 85 degrees or 140 degrees to 180 degrees with respect to the c-axis of the III nitride region. This enables the amplitude of the piezoelectric field of the III nitride channel to be smaller than that of the channel layer on the c-plane, so that, when a gate electrode is provided on the epitaxial wafer, normally-off characteristics is provided while a non-zero amplitude of the piezoelectric field remains.

The epitaxial wafer according to the other aspect of the present invention may further comprise (d) a second III nitride barrier layer that forms a second heterojunction with the second surface of the III nitride channel layer. The second III nitride barrier layer is provided on the III nitride channel layer; the second III nitride barrier layer forms the second heterojunction with the III nitride channel layer; and the second heterojunction extends along a plane having a normal axis that is inclined at an inclination angle in the range of 40 degrees to 85 degrees or 140 degrees to 180 degrees with respect to the c-axis of the III nitride region.

In this epitaxial wafer, the second III nitride barrier layer forms the second heterojunction with the second surface of the III nitride channel layer, which allows the second heterojunction to function as a channel. Hence, an epitaxial wafer for a transistor having a dual channel structure is provided.

A further aspect of the present invention provides a method of fabricating a high electron mobility transistor. The method comprises the steps of: (a) preparing a free-standing substrate, the free-standing substrate including a III nitride region; (b) growing a first III nitride barrier layer on the III nitride semiconductor region; (c) growing a III nitride channel layer on the first III nitride barrier layer; and (d) forming a gate electrode on the III nitride channel layer, the gate electrode being configured to exert an electric field on the first heterojunction. The III nitride channel layer includes compressive internal strain such that a piezoelectric field in the III nitride channel layer is oriented in a direction from the supporting base towards the first III nitride barrier layer. The III nitride channel layer forms a first heterojunction with the first III nitride barrier layer. A primary surface of the substrate extending along a plane having a normal axis inclined at an inclination angle in a range of 40 degrees to 85 degrees or 140 degrees to 180 degrees with respect to a c-axis of the III nitride region, and the first heterojunction extending along a plane having a normal axis inclined at an inclination angle in a range of 40 degrees to 85 degrees or 140 degrees to 180 degrees with respect to the c-axis of the III nitride region.

In this method, after providing a substrate having a primary surface, composed of a III nitride region, which extends along a plane having a normal axis that tilts at a tilt angle in the range of 40 degrees to 85 degrees or 140 degrees to 180 degrees with respect to the c-axis of the III nitride region, a III nitride channel layer is grown on the first III nitride barrier layer. Accordingly, the first III nitride barrier layer is provided between the III nitride semiconductor region and the III nitride channel layer. The III nitride channel layer incorporates compressive strain, and the piezoelectric field of the III nitride channel layer may be oriented in the direction from the substrate toward the first III nitride barrier layer. This allows the amplitude of the piezoelectric field of the III nitride channel layer to be lower than that of a channel layer on the c-plane, so that, when a gate electrode is provided on the epitaxial wafer, normally-off characteristics is provided while a non-zero amplitude of the piezoelectric field remains.

The other aspect of the present invention may further comprise the step of growing a second III nitride barrier layer on a second surface of the III nitride channel layer, the second III nitride barrier layer forms a second heterojunction with the III nitride channel layer. The second III nitride barrier layer is provided on the III nitride channel layer; the second III nitride barrier layer forms the second heterojunction with the III nitride channel layer; and the second heterojunction extends along a plane having a normal axis that is inclined at an inclination angle in the range of 40 degrees to 85 degrees or 140 degrees to 180 degrees with respect to the c-axis of the first III nitride barrier layer.

In this method, the second III nitride barrier layer is grown and forms the second heterojunction with the second plane of the III nitride channel layer, and the second heterojunction can be formed so as to function as a channel. Accordingly, an epitaxial wafer for a transistor of a dual channel structure is provided.

In this aspect of the present invention, the supporting base may be composed of III nitride. According to the aspect of the present invention, when the supporting base is composed of III nitride, the strain changes depending upon a difference in lattice constant between the III nitride of the supporting base and III nitride semiconductor grown thereon, and the crystal quality of the III nitride semiconductor grown on the III nitride of the supporting base is improved.

In this aspect of the present invention, preferably the first III nitride barrier layer has a band gap greater than that of the III nitride channel layer, and the material of the III nitride channel layer comprises $In_xGa_{1-x}N$ ($0<X\leq1$) while the material of the first III nitride barrier layer comprises $In_YAl_ZGa_{1-Y-Z}N$ ($0\leq Y<1$, $0\leq Z\leq1$, $0\leq Y+Z\leq1$).

In the present aspect of the present invention, the strain in the III nitride channel layer can be adjusted based on the relation of the difference in lattice constant between $In_xGa_{1-x}N$ in the III nitride channel layer and $In_YAl_ZGa_{1-Y-Z}N$ in the first III nitride barrier layer.

In the present aspect of the present invention, the primary surface of the supporting base extends along a plane having a normal axis that is inclined at an inclination angle in the range of 40 degrees to 85 degrees or 140 degrees to 180 degrees with respect to the c-axis of the first III nitride barrier layer.

According to the present aspect of the present invention, the inclination of the c-axis of the heterojunction may be achieved by the direction of the primary surface of the supporting base.

In the present aspect of the present invention, the supporting base may be composed of GaN. This aspect of the present invention enables utilization of a GaN supporting base having excellent crystal quality.

In the present aspect of the present invention, the first heterojunction has an inclination angle in the range of 50 degrees to 80 degrees. According to the present aspect of the present invention, the inclination angle in this range leads to formation of a piezoelectric field with a certain level of negative magnitude.

In the present aspect of the present invention, preferably the III nitride channel layer comprises material containing indium as a group-III constituent element, and the first heterojunction has an inclination angle in the range of 63 degrees to 80 degrees.

According to this aspect of the present invention, in the channel layer comprising material containing indium as a group-III constituent element, the inclination angle in this range enables the channel layer to incorporate indium at high efficiency, leading to enhanced mobility.

In the present aspect of the present invention, the inclination angle of the first heterojunction may be in the range of 70 degrees to 80 degrees. According to the present aspect of the present invention, the inclination angle in this range can reduce segregation of indium in the channel layer, leading to enhanced mobility in the channel layer.

In the present aspect of the present invention, the inclination angle of the first heterojunction may be in the range of 145 degrees to 170 degrees. According to this aspect of the present invention, in the channel layer comprising material containing indium as a group-III constituent element, the inclination angle in this range can allow the channel layer to incorporate indium at high efficiency, leading to enhanced mobility.

In the present aspect of the present invention, a buffer layer may be provided between the first III nitride barrier layer and the supporting base. According to this aspect of the present invention, in the buffer layer comprising an undoped GaN, the buffer layer has excellent crystal quality and high specific resistance, resulting in suppressed leakage in the transistor.

In the present aspect of the present invention, the buffer layer may contain n-type and p-type impurities, preferably the concentration of the n-type impurity is not less than $1 \times 10^{17}$ cm$^{-3}$ and the concentration of the p-type impurity is not less than $1 \times 10^{17}$ cm$^{-3}$. According to this aspect of the present invention, addition of n-type and p-type dopants increases the specific resistance by dopant compensation.

In the present aspect of the present invention, the n-type impurity may be oxygen. The surface of a substrate that is inclined at an inclination angle in the off-angle range described above tends to incorporate oxygen during epitaxial growth to increase the oxygen concentration of the epitaxial layer, which causes its conductivity to tend to an n-type. In order to suppress this, a p-type dopant is added for dopant compensation during epitaxial growth.

In the present aspect of the present invention, the p-type impurity may comprise at least one of carbon, magnesium, and zinc. According to this aspect of the present invention, a p-type impurity is added as a p-type dopant.

In the present aspect of the present invention, the supporting base may be semi-insulating. This aspect of the present invention can reduce the parasitic capacitance in the transistor.

In the present aspect of the present invention, the supporting base may be conductive. According to this aspect of the present invention, when an insulating AlN layer or a Mg-doped $In_XAl_YGa_{1-X-Y}N$ ($0 \leq X \leq 1$, $0 \leq Y \leq 1$) layer is provided between the buffer layer and the supporting base, a conductive substrate can be used.

The present aspect of the present invention may comprise an $Al_WGa_{1-W}N$ ($0<W\leq1$) layer provided between the III nitride channel layer and the supporting base.

According to the present aspect of the present invention, the $Al_WGa_{1-W}N$ layer such as the AlN layer may suppress leakage current to the supporting base because the AlN layer has an insulation property. The AlN layer may be provided in contact with the supporting base or within the undoped GaN buffer layer. The AlN layer may have a thickness of about 20 nm. An excessively thick AlN layer in thickness may degrade the crystal quality of the epitaxial layer. An excessively thin AlN layer in thickness may not provide sufficient insulation.

In the present aspect of the present invention, the gate electrode forms a Schottky junction with the III nitride channel layer. This aspect of the present invention can provide a single-channel transistor having normally-off characteristics.

In the present aspect of the present invention, the second III nitride barrier layer may have a band gap smaller than that of the first III nitride barrier layer. According to this aspect of the present invention, carriers from the second III nitride barrier layer are supplied to the channel depending on the band gap between the second III nitride barrier layer and the channel layer.

In the present aspect of the present invention, the material for the second III nitride barrier layer has an intrinsic lattice constant smaller than that of the material for the first III nitride barrier layer. According to this aspect of the present invention, the second III nitride barrier layer has compressive internal strain.

In the present aspect of the present invention, the second III nitride barrier layer incorporates compressive strain, and the piezoelectric field of the second III nitride barrier layer is oriented in the direction from the supporting base toward the first III nitride barrier layer.

The foregoing and other objects, features, and advantages of the invention will become more readily apparent from the following description of preferred embodiments in connection with the accompanying drawings.

DETAILED DESCRIPTION OF THE PREFERRED EMBODIMENTS

The teaching of the present invention can be readily understood from the following description with reference to the accompanying drawings by way of example.

In reference to the accompanying drawings, the embodiments of a high electron mobility transistor, an epitaxial wafer, and a method of fabricating the high electron mobility transistor will be explained below. The same reference numbers are assigned to the same parts, if possible.

Figure 1:
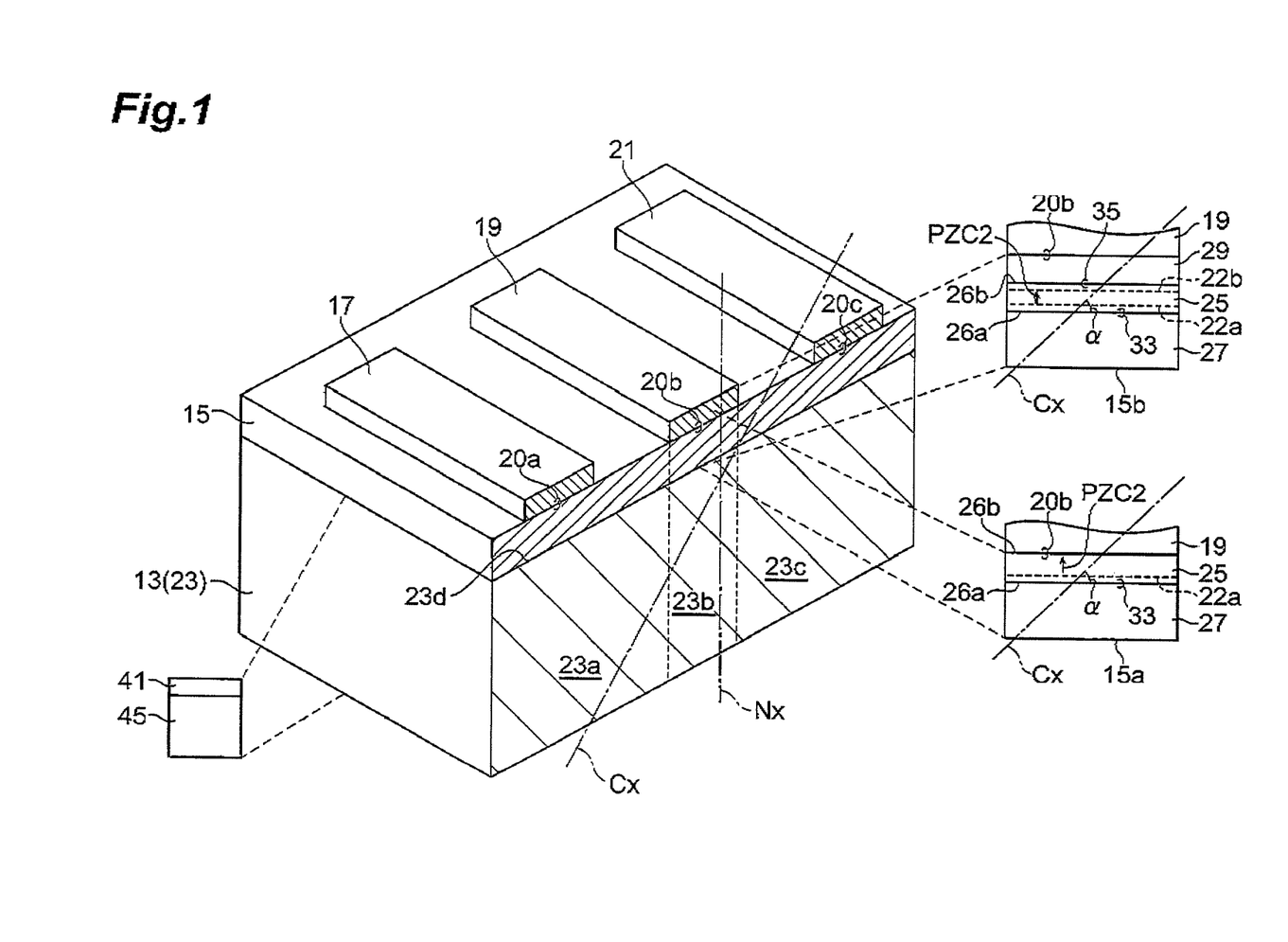
FIG. 1 is a schematic view illustrating the structure of a high electron mobility transistor in accordance with an embodiment.
Figure 2:
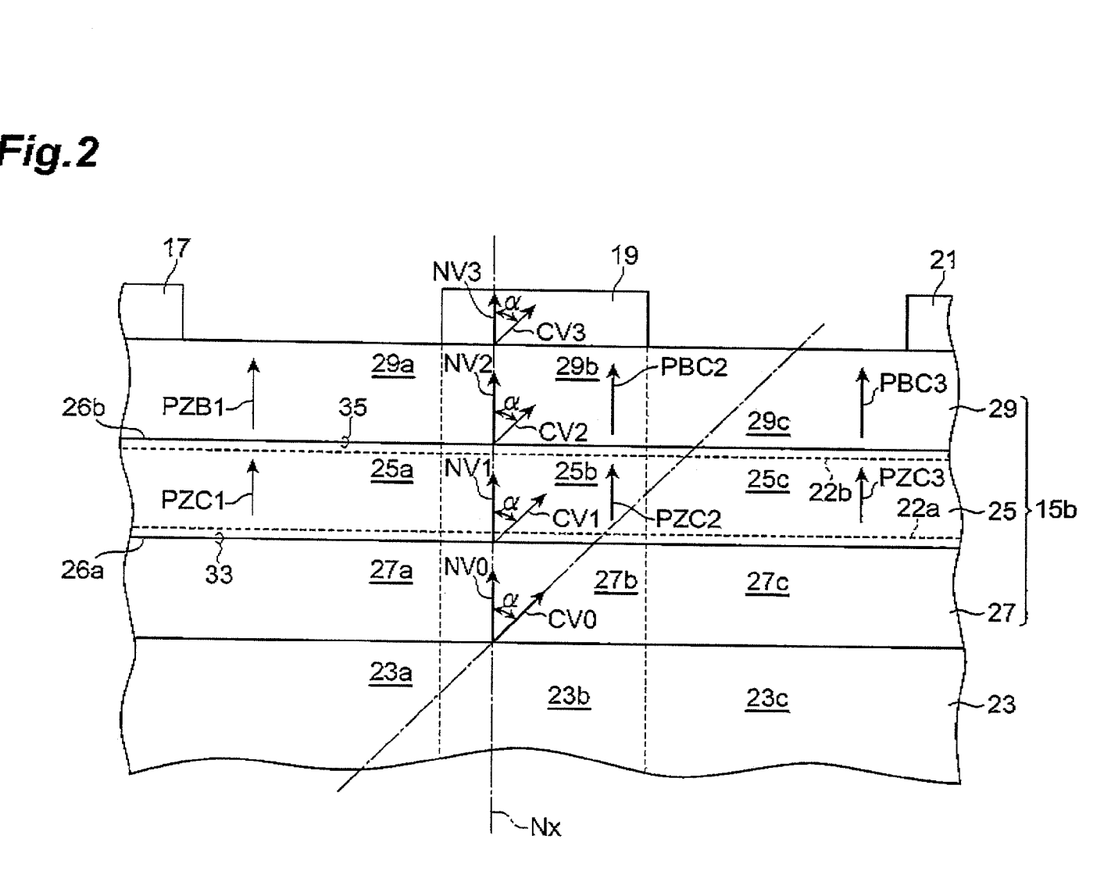
FIG. 2 is a schematic view illustrating the channel portion of the high electron mobility transistor.

FIG. 1 is a schematic view illustrating the structure of a high electron mobility transistor in accordance with an embodiment. FIG. 2 is a schematic view illustrating a channel portion of the high electron mobility transistor illustrated in FIG. 1. The high electron mobility transistor 11 includes a supporting base 13, a semiconductor laminate 15 (15a, 15b), a source electrode 17, a gate electrode 19, and a drain electrode 21. A free-standing supporting base 13 includes a III nitride region 23, which is provided at least in its upper part. The III nitride region 23 includes a first region 23a, second region 23b, and third region 23c, which are sequentially aligned on the substrate primary surface along a predetermined axis. The gate electrode 19 is provided on the second region 23b and the primary surface of the semiconductor laminate 15, and, for example, forms a Schottky junction 20b with the primary surface of the semiconductor laminate 15. The source electrode 17 is provided on the primary surface of the semiconductor laminate 15, and is located on the first region 23a in the present embodiment. The source electrode 17 forms, for example, an ohmic junction 20a with the primary surface of the semiconductor laminate 15. The drain electrode 21 is provided on the primary surface of the semiconductor laminate 15 and over the third region 23c in this embodiment. The drain electrode 21 forms, for example, an ohmic junction 20c with the primary surface of the semiconductor laminate 15.

The semiconductor laminate 15a includes a III nitride channel layer (hereinafter referred to as a "channel layer") 25 and the first III nitride barrier layer (hereinafter referred to as a "barrier layer") 27, and the barrier layer 27 and the channel layer 25 are sequentially arranged along the normal axis of the primary surface 23d of the III nitride region 23. The channel layer 25 and the barrier layer 27 form a first heterojunction 33 at which two-dimensional carrier gas 22a is created on the surface 26a of the channel layer 25 in the vicinity of the interface thereof. The gate electrode 19 controls the creation of the two-dimensional carrier gas 22a via the channel layer 25 in the vicinity of the interface between the channel layer 25 and the barrier layer 27. When a voltage applied to the gate electrode 19 is zero volts, a channel along the first heterojunction 33 is not created. The structure of the semiconductor laminate 15a can provide a normally-off transistor having a single channel structure.

The channel layer 25, the barrier layer 27, and the barrier layer 29 of the semiconductor layer 15b are arranged in sequence along the normal axis of the primary surface 23d of the III nitride region 23. The channel layer 25 is provided between the first barrier layer 27 and the second barrier layer 29. The channel layer 25 and the barrier layer 27 form the first heterojunction 33 at which two-dimensional carrier gas 22a is created along the surface 26a of the channel layer 25 in the vicinity of the interface. The channel layer 25 and the barrier layer 29 form a second heterojunction 35 at which two-dimensional carrier gas 22b is created along the surface 26b of the channel layer 25 in the vicinity of the interface. The gate electrode 19 controls the generation of the two-dimensional carrier gases 22a and 22b through the barrier layer 29 and the channel layer 25 in the channel layer 25 and in the vicinities of the interfaces between the channel layer 25 and the barrier layer 27 and between the channel layer 25 and the barrier layer 29. When a voltage applied to the gate electrode 19 is zero volts, no channel is created along the heterojunctions 33 and 35. The gate electrode 19 exerts an electric field on the two-dimensional carrier gas 22a and 22b, which are in the channel layer 25 in the vicinities of the interfaces between the channel layer 25 and the barrier layer 27 and between the channel layer 25 and the barrier layer 29, via the barrier layer 29 and the channel layer 25. The structure of the semiconductor laminate 15b can provide a normally-off transistor having a dual-channel structure.

The first heterojunction 33 extends along a plane having a normal axis that is inclined at an inclination angle $\alpha$ in the range of 40 degrees to 85 degrees or 140 degrees to 180 degrees with respect to the c-axis of the III nitride region 23, and the channel layer 25 incorporates compressive internal strain. A piezoelectric field PZC2 in the channel layer 25 is oriented in the direction from the supporting base 13 toward the first barrier layer 27.

The source electrode 17 is electrically connected to the channel layer 25 on the second region 23b via the channel layer 25 located on the first region 23a, and the drain electrode 21 is electrically connected to the channel layer 25 on the second region 23b via the channel layer 25 located on the third region 23c, allowing carriers (e.g., electrons) to flow into the channel layer 25.

The arrangements and structures of the channel layer 25 and the barrier layer 27 in the semiconductor region 15a are the same as those of the channel layer 25 and the barrier layer 27 included in the arrangements and structures of the channel layer 25 and the barrier layers 27 and 29 in the semiconductor region 15b. Accordingly, the arrangements and structures in the semiconductor region 15b are explained below, and this explanation shows the arrangements and structures in the semiconductor region 15a.

The channel layer 25 includes a first surface 26a and a second surface 26b which is opposite to the first surface 26a. The first surface 26a of the channel layer 25 forms a first heterojunction 33 with a first barrier layer 27, and the second surface 26b of the channel 25 forms a second heterojunction 35 with a second barrier layer 29.

Referring to FIG. 2, in the semiconductor region 15b, the normal axis Nx of the primary surface 24b of the second region 23b (represented as "normal vector NV0") is inclined at a finite angle $\alpha$ with respect to the reference axis Cx that extends along the c-axis of the III nitride semiconductor (represented as "c-axis vector CV0").

The axis Nx normal to the primary surface of the second region 27b (represented as "normal vector NV1") is inclined at a finite angle $\alpha$ with respect to the reference axis that extends along the c-axis of the III nitride semiconductor of the first barrier layer 27 (represented as "c-axis vector CV1").

The axis Nx normal to the primary surface of the second region 25b (represented as "normal vector NV2") is inclined at a finite angle $\alpha$ with respect to the reference axis that extends along the c-axis of the III nitride semiconductor of the channel layer 25 (represented as "c-axis vector CV2").

The axis Nx normal to the primary surface of the second region 29b (represented as "normal vector NV3") is inclined at a finite angle $\alpha$ with respect to the reference axis that extends along the c-axis of the III nitride semiconductor of the second barrier layer 29 (represented as "c axis vector CV3").

When the material of the second barrier layer 29 is the same as that of the first barrier layer 27 or the III nitride region 23, the channel layer 25 incorporates compressive internal strain, while the barrier layer 29 does not incorporate any internal strain. When the following conditions are satisfied: the material of the second barrier layer 29 is different from that of the first barrier layer 27 or the III nitride region 23; and the second barrier layer 29 has the lattice constant larger than that of the first barrier layer 27 or the III nitride region 23, the channel layer 25 and the channel 29 both incorporate compressive internal strain. Accordingly, as shown in FIG. 2, the piezo-polarization PZC2 in the second region 25b of the channel layer 25 and the piezo-polarization PZB2 in the second region 29b of the barrier layer 29 are similarly oriented in the direction from the first heterojunction 33 toward the second heterojunction 35. In the present invention, the respective piezoelectric fields (PZC1, PZC3) of the first and third regions (25a, 25c) of the channel layer 25 in the first and the third regions (23a, 23c) are similarly oriented in the direction from the first heterojunction 33 toward the second heterojunction 35.

The piezo-polarization PZC2 of the second region 25b of the channel layer 25 is oriented in the direction from the first surface 26a toward the second surface 26b of the channel 25. In this embodiment, the respective piezo-polarizations (PZC1, PZC3) in the first and third regions (25a, 25c) of the channel layer 25 are oriented in the direction from the first surface 26a toward the second surface 26b of the channel layer 25. When III nitride region 23, the barrier layer 27 and the barrier layer 29 are composed of GaN, no piezoelectric field is created in the barrier layer 29. When the barrier layer 29 is composed of one of InGaN and InAlGaN that have a lattice constant smaller than that of the III nitride region 23 or barrier layer 27, the barrier layer 29 incorporates compressive inner strain to produce a piezoelectric field in the barrier layer 29. In this case, the respective piezo fields (PZB1, PZB3) in the first and third regions (29a, 29c) of the barrier layer 29 in the first and third regions (23a, 23c) are oriented in the direction from the first heterojunction 33 toward the second heterojunction 35.

According to the transistor 11, the channel layer 25 is provided on the first barrier layer 27, and forms the heterojunction 33 with the first barrier layer 27. The channel layer 25 incorporates compressive inner strain, and the piezoelectric field PZC2 of the channel layer 25 is oriented in the direction from the supporting base 13 toward the first barrier layer 27. When the first heterojunction 33 extends along the plane that is inclined at an inclination angle α in the range of 40 degrees to 85 degrees or 140 degrees to 180 degrees with respect to the c-plane of the III nitride region 23, the magnitude of the piezoelectric field PZC2 in the channel layer 25 just below the gate electrode 19 can be made smaller as compared with that of the c-plane, leading to realization of the normally-off characteristics with a non-zero amplitude of the piezoelectric field remained.

A channel in the first heterojunction 33 is created by the actions of the electric field from the gate electrode 19 and the piezoelectric field PZC2 in the channel layer 25 below the gate electrode 19. The concentration of the two-dimensional electron gas per unit area is determined by the magnitudes of both the piezoelectric field PZC2 and the gate electric field at the first heterojunction 33.

A channel in the second heterojunction 35 is formed by the action of the gate electric field at the second heterojunction 33. The concentration of the two-dimensional electron gas per unit area is determined by the magnitude of the gate electric field at the second heterojunction 35. Accordingly, the transistor 11 can be provided with normally-off characteristics by use of a non-zero magnitude of the piezo-polarization. As described above, the gate electrode exerts the electric field on the second region 25b of the channel layer 25 below the gate electrode 19. Meanwhile, in the first region 25a and the third region 25c of the channel layer 25, a non-zero magnitude of piezoelectric field contributes, in some degree, to sheet carrier generation, and the on-resistance can be made lower depending on this magnitude.

In order to suppress leakage current in the gate, an insulating film is provided between the gate electrode and the channel layer to make so-called MIS gate structure. Examples of materials for insulating films include $SiO_2$, SiN, $ZrO_2$, $HfO_2$, $Ga_2O_3$, AlN or $Al_2O_3$, and the combination thereof. The thickness of the film may be about 1 to 100 nm.

The III nitride region 23 of the transistor 11 may include, a buffer layer 41 composed of gallium nitride, if necessary. The barrier layer 27 is provided between the channel layer 25 and the buffer layer 41. In the transistor 11, the specific resistance of the buffer layer 41 can be made high, leading to a reduction in buffer leakage. The buffer layer 41 may be composed of, for example, gallium nitride. The buffer layer 41 may be composed of, for example, an undoped semiconductor.

The transistor 11 may comprise an $Al_WGa_{1-W}N$ ($0<W\leq1$) layer which can act as the buffer layer 41. The buffer layer 41 is provided between the channel layer 25 and the supporting base 13. When, for example, an AlN layer is used as the $Al_WGa_{1-W}N$ layer, this $Al_WGa_{1-W}N$ layer can prevent leakage to the supporting base 13 because the AlN layer has insulating properties. The AlN layer may be disposed in contact with the substrate or within the undoped GaN buffer layer. The thickness of the AlN layer may be about 20 nm. An excessively thick AlN layer may degrade the crystal quality of the epitaxial layer. An excessively thin AlN layer does not provide sufficient insulation.

In the transistor 11, the gallium nitride of the buffer layer 41 may contain n-type and p-type impurities, if necessary, which are useful for carrier compensation. Addition of, for example, n-type and p-type impurities ensure high specific resistance of the buffer layer 41. The concentration of n-type impurities is preferably at least $1\times10^{17}$ cm$^{-3}$. The n-type impurity may encompass at least any one of oxygen, Si and Ge. The concentration of p-type impurity is preferably at least $1\times10^{17}$ cm$^{-3}$. The p-type impurity may encompass at least any one of carbon, magnesium and zinc.

In the transistor 11, the channel layer 25 may include, for example, an InGaN layer. The first barrier layer 27 may include, for example, a GaN layer. The second barrier layer 29 may comprise, for example, material having a band gap greater than that of InGaN of the channel layer 25 and smaller than or equal to that of GaN of the barrier layer 27. Alternatively, the second barrier layer 29 may comprises, for example, material having a lattice constant (a-axis, c-axis) of III nitride of the second barrier layer 29 smaller than that of InGaN of the channel layer 25 and greater than or equal to that of GaN of the first barrier layer 27.

The III nitride semiconductor region 23 may comprise, for example, GaN. The supporting base 13 may further include a substrate 45 which mounts the semiconductor laminate 15 thereon. The transistor 11 can achieve one of the practical structures. The substrate 45 may be semi-insulating, and this transistor 11 can provide low buffer leakage.

In the transistor 11, the first barrier layer 27 has a band gap greater than that of the channel layer 25, and the material of the channel layer 25 comprises $In_XGa_{1-X}N$ ($0<X\leq1$) and the material of the first barrier layer 27 comprises $In_YAl_ZGa_{1-Y-Z}N$ ($0\leq Y<1, 0\leq Z\leq1, 0\leq Y+Z\leq1$). Strain in the channel layer 25 can be adjusted depending on the difference in lattice constant between $In_XGa_{1-X}N$ in the channel layer 25 and $In_YAl_ZGa_{1-Y-Z}N$ in the first barrier layer 27. In the transistor 11, the channel 25 is not limited to the above-described embodiments, and the channel 25 may comprise, for example, InAlN. The barrier layer 27 may comprise, for example, GaN, AlGaN or InAlGaN. The barrier layer 29 may comprise, for example, GaN or InAlGaN. The III nitride semiconductor region 23 may comprise, for example, GaN or AlGaN. The thickness of the channel layer 25 may be, for example, 5 nm to 500 nm. The thickness of the barrier layer 29 may be, for example, 10 nm to 500 nm. The thickness of the barrier layer 27 may be, for example, 10 nm to 50 μm.

In the transistor 11, when the lattice constants satisfy the following condition: an intrinsic lattice constant of the a-axis or c-axis (strain-free lattice constant) of III nitride of the channel layer 25 is greater than an intrinsic lattice constant of the a- or c-axis of material of the first barrier layer 27; or an intrinsic lattice constant of the a-axis or c-axis of III nitride of the channel layer 25 is greater than an intrinsic lattice constant of the a- or c-axis of material of the III nitride semiconductor region 23, the channel layer 25 incorporates compressive internal strain. If necessary, the III nitride semiconductor region 23 can be used as the first barrier layer 27.

When coherent growth of the channel layer 25 is made on the primary surface of the first barrier layer 27, the first barrier layer 27 and/or the III nitride semiconductor region 23 exert stress on the channel layer 25, so that the channel layer 25 incorporates the compressive strain. When lattice constants satisfy the following conditions: a lattice constant of the a-axis inherent in III nitride of the barrier layer 29 is smaller than that inherent in the III nitride of the channel layer 25; and a lattice constant of the a-axis or c-axis inherent in III nitride of the barrier layer 29 is smaller than that inherent in III nitride of the first barrier layer 27 and/or the III nitride semiconductor region 23, and the barrier layer 29 is subjected to stress from the first barrier layer 27 and/or the III nitride semiconductor region 23 via the channel layer 25, so that the channel 25 incorporates compressive strain and the second barrier layer 29 incorporates compressive strain smaller than that of the channel layer 25. If the barrier 29 and the III nitride semiconductor region 23 are composed of the same material, the second barrier layer 29 is substantially strain-free.

An embodiment of the transistor 11 illustrated in FIGS. 1 and 2 can provide both the utilization of a potential produced by the piezoelectric field and normally-off characteristics. The high electron mobility transistor has a structure explained below. For example, the primary surface of the second region 23b of the III nitride semiconductor region 23 extends along the plane that is inclined at an inclination angle in the range of 40 degrees to 85 degrees or 140 degrees to 180 degrees with respect to the plane perpendicular to the reference axis Cx of the III nitride region. As will be understood from the above explanation, the normally-off transistor can be achieved depending on the direction and magnitude of the piezoelectric field in the channel layer 25.

The vector normal to the primary surface of the first region 23a of the III nitride semiconductor region 23 may be inclined at an angle in the range of 40 degrees to 85 degrees or 140 degrees to 180 degrees with respect to the reference axis vector. The normal vector of the primary surface of the third region 23c of the III nitride semiconductor region 23 may be inclined at an angle in the range of 0 degrees to 40 degrees or 90 degrees to 140 degrees with respect to the reference axis vector. The magnitude and direction of the piezo-polarization of the channel layer 25 is adjusted by the angle that the normal vector of the primary surface of the III nitride semiconductor region 23, for example, the c-axis vector forms with. The piezoelectric field that can maintain the normally-off in the channel portion remains in the first layer 25a and the third layer 25c of the channel layer 25. The piezoelectric field remaining therein can contribute to the band bending at the interface.

The transistor 11 of the above embodiment has the following structure. On the second region 23b, the vector normal to the second heterojunction 33 forms an angle with the reference axis vector in the range of 40 degrees to 90 degrees or 140 degrees to 180 degrees. On the first region 23a, the normal vector of the second heterojunction 35 forms an angle with the reference axis vector in the range of zero degrees to 40 degrees or 90 degrees to 140 degrees. On the third region 23c, the normal vector of the second heterojunction 35 forms an angle with the reference axis vector in the range of zero degrees to 40 degrees or 90 degrees to 140 degrees. The magnitude and direction of the piezo-polarization in the channel layer 25 is adjusted by the angle that the normal vector of the second heterojunction 35 forms with, for example, the c-axis vector.

The transistor 11 of an embodiment has the following structure. On the first region 23a, the normal vector of the second heterojunction 35 forms an angle with the reference axis vector in the range of zero degrees to 40 degrees or 90 degrees to 140 degrees. On the second region 23b, the normal vector of the second heterojunction 35 forms an angle with the reference axis vector in the range of 40 degrees to 90 degrees or 140 degrees to 180 degrees. On the third region 23c, the normal vector of the second heterojunction 35 forms an angle with the reference axis vector in the range of zero degrees to 40 degrees or 90 degrees to 140 degrees. The magnitude and direction of the piezoelectric field of the channel layer 25 is adjusted by the angle that the normal vector of the second heterojunction 35 forms with, for example, the c-axis vector.

The vector normal to the first heterojunction 33 may be inclined at an angle in the range of 50 degrees to 80 degrees with respect to the reference axis vector. The inclination angle in this range leads to production of a piezoelectric field with a certain level of negative magnitude. The normal vector of the second heterojunction 35 may be inclined at an angle in the range of 50 degrees to 80 degrees with respect to the reference axis vector. The vector normal to the primary surface of the supporting base 13 may be inclined at an angle in the range of 50 degrees to 80 degrees with respect to the reference axis vector. The first heterojunction 33 has such an inclination angle.

The channel layer 25 comprises a material containing indium as a group III constituent element, and the normal axis vector of the first heterojunction 33 may be inclined at an angle in the range of 63 degrees to 80 degrees with respect to the reference axis vector. The channel layer 25 that comprises a material containing indium as a constituent group III element can incorporate indium at high efficiency at the tilt angle in this range, resulting in enhanced indium mobility. The same technical advantage can be achieved from the angle of the opposite plane corresponding to the angle in this range. The normal axis vector of the primary surface of the supporting base 13 may be inclined at an angle in the range of 63 degrees to 80 degrees with respect to the reference axis vector. The first heterojunction 33 can be provided with such an inclination angle.

The vector normal to the first heterojunction 33 may be inclined at an angle in the range of 70 degrees to 80 degrees with respect to the reference axis vector. In the inclination angle in this range, segregation of indium in the channel layer 25 can be made reduced, leading to further enhanced mobility in the channel layer 25. The similar technical contribution can be provided to the angle range corresponding to crystal orientations opposite to those in the above angle range. The normal axis vector of the primary surface of the supporting base 13 may be inclined at an angle in the range of 70 degrees to 80 degrees with respect to the reference axis vector. The first heterojunction 33 can be provided with such an inclination angle.

The normal vector of the first heterojunction 33 may be inclined at an angle in the range of 145 degrees to 170 degrees with respect to the reference axis vector. When the channel layer 25 comprises a material containing indium as a group III constituent element, indium can be incorporated into the channel layer 25 at a high efficiency at an inclination angle in this range, resulting in enhanced mobility. The normal axis vector of the primary surface of the supporting base 13 may be inclined at an angle in the range of 145 degrees to 170 degrees with respect to the reference axis vector. The first heterojunction 33 can be provided with such an inclination angle.

The channel layer 25 of the high electron mobility transistor of the preferred embodiment comprises a III nitride semiconductor containing indium as a group III constituent element. The channel layer 25 extends along the plane that has a normal vector inclined at an inclination angle in the range of 63 degrees to 80 degrees with respect to the reference axis vector. In the transistor 11, the normal vector of the second region 25b of the channel layer 25 forms an angle with the reference axis vector in the range of 63 degrees to 80 degrees on the III nitride semiconductor. The growth of the channel layer 25 at the angle in this range exhibits efficient indium incorporation to provide the channel layer 25 with the excellent crystal quality, resulting in enhanced mobility of carriers.

In the high electron mobility transistor 11 of a preferred embodiment, the channel layer 25 extends along the plane that has a normal axis inclined at an inclination angle in the range of 70 degrees to 80 degrees with respect to the reference axis vector. The growth of the channel layer 25 at the angle in this range can reduce segregation of indium in the channel layer, leading to enhanced mobility of carriers flowing in the channel layer 25.

Figure 3:
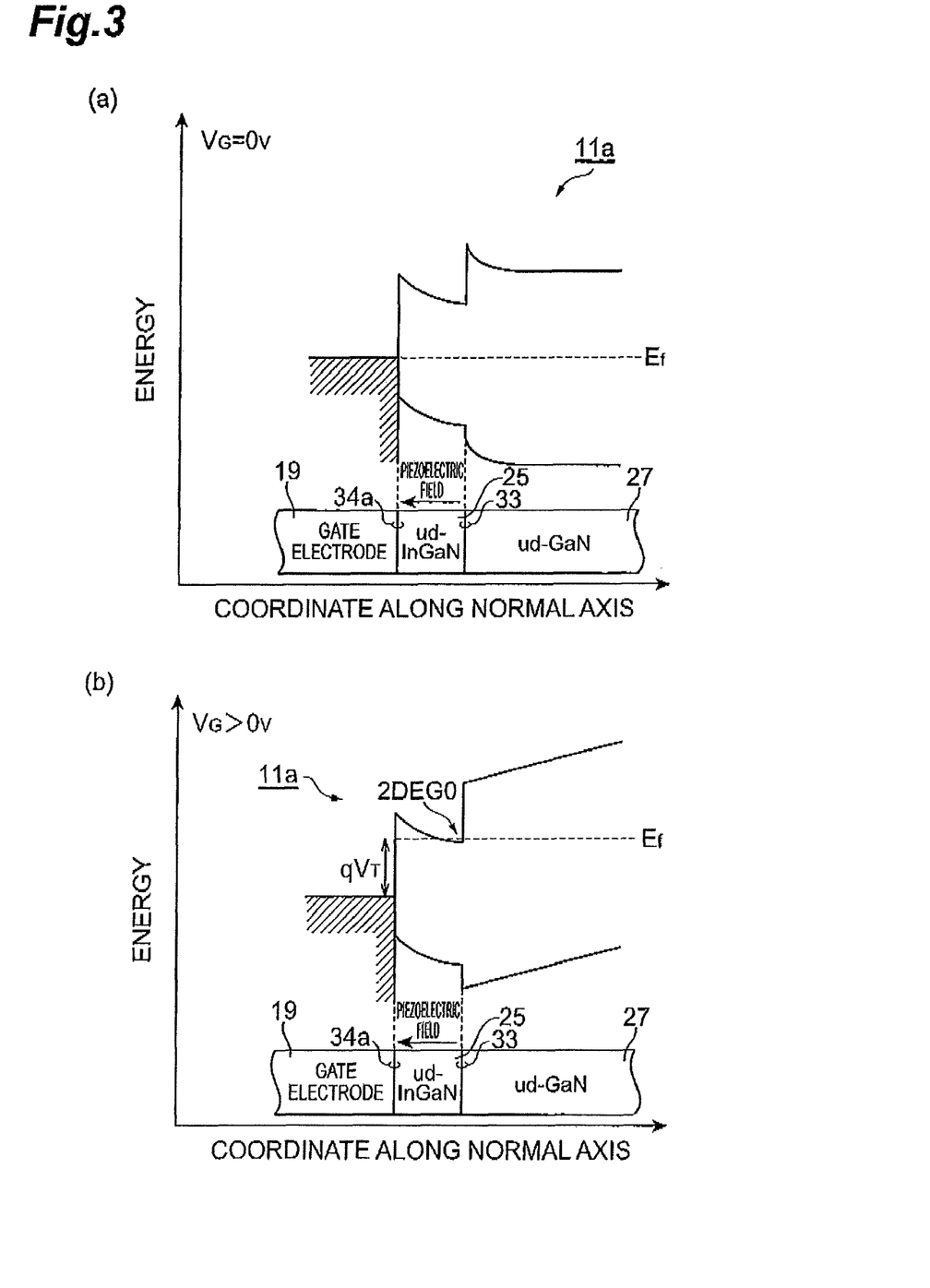
FIG. 3 is a band diagram at a channel portion including a single heterojunction-system formed by a first barrier layer and a channel layer.

FIG. 3 is a band diagram in a channel portion having a single heterojunction structure which includes a first barrier layer and a channel layer. The channel portion includes the second regions 23b, 25b and 27b illustrated in FIG. 2. The source/drain portion includes the first regions 23a, 25a and 27a or the third regions 23c, 25c and 27c illustrated in FIG. 2. The gate electrode 19 forms a Schottky junction 34 with the channel layer 25.

Part (a) of FIG. 3 shows an energy diagram of the channel portion. On the second region 25b of the channel layer 25 just below the gate electrode 19, when a potential Vg applied to the gate voltage 19 is zero, the energy in the channel layer increases from the barrier layer 27 toward the gate electrode 19. Since the piezoelectric field is not so large, the bottom of the conduction band is higher than the Fermi level therein, so that two-dimensional electron gas is not induced in the channel layer 25 along the heterojunction 33. Accordingly, at a zero potential Vg applied to the gate electrode 19, the transistor 11 is turned off.

Part (b) of FIG. 3 shows an energy diagram of a channel portion having a non-zero magnitude of potential applied to the gate. The application of the non-zero potential $V_T$ to the gate electrode 19 lowers the energy band of the channel 25, so that the conduction band approaches the Fermi level. In the heterojunction 33 of the second region 25b of the channel layer 25 just below the gate electrode 19, two-dimensional electron gas (2DEG0) is induced in response to a potential change ($q \times V_T$) caused by the gate potential. The transistor 11a is turned on at a threshold voltage $V_T$. Accordingly, the single-channel transistor 11a is provided with normally-off operation.

Figure 4:
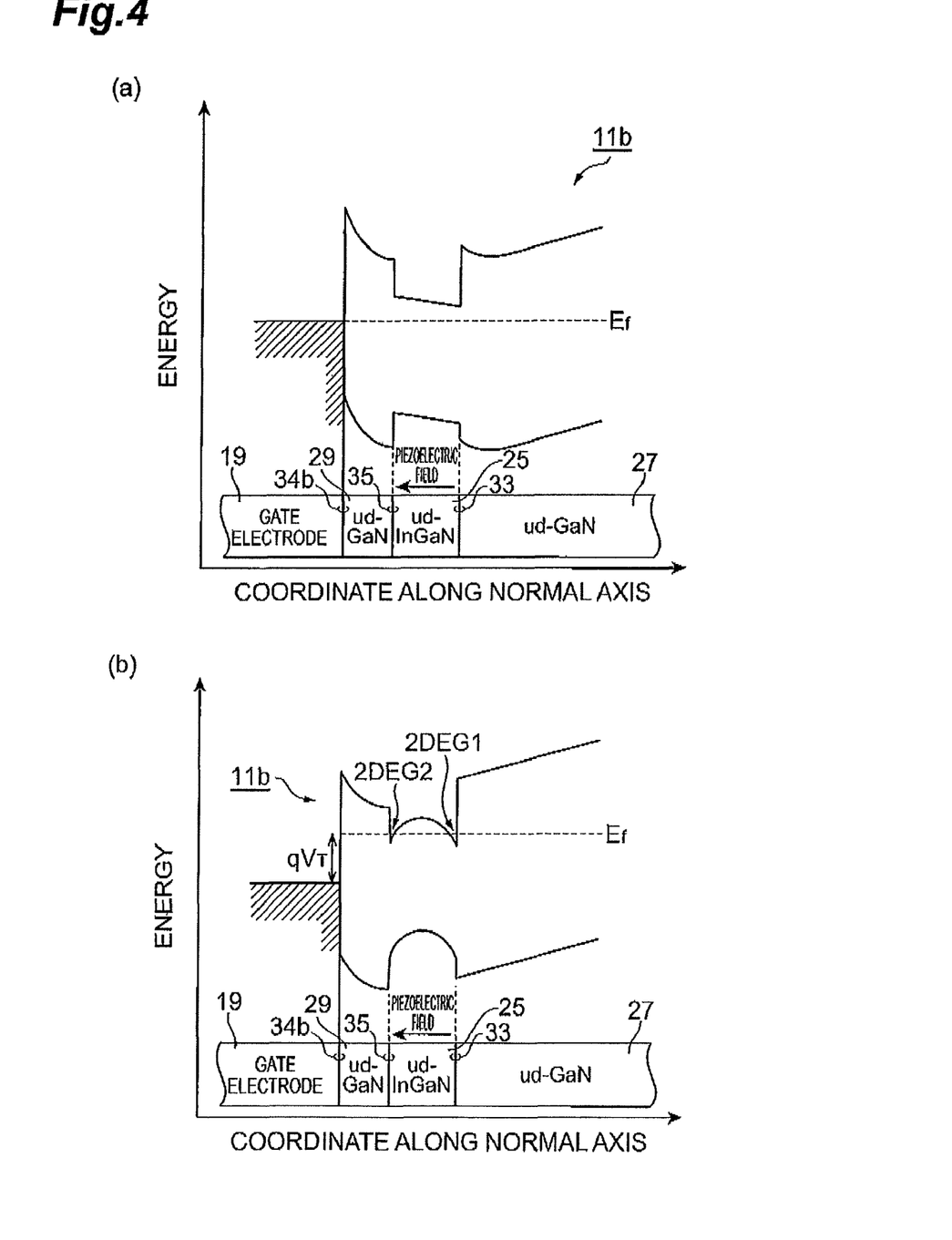
FIG. 4 is a band diagram at a channel portion containing a double heterojunction-system formed by a first barrier layer, a channel layer, and a second barrier layer.

FIG. 4 is a band diagram at a channel portion containing a double heterojunction structure, which is constituted by a first barrier layer, a channel layer and a second barrier layer. The channel portion comprises the second regions 23b, 27b, 25b and 29b illustrated in FIG. 2. The source/drain portion comprises the first regions 23a, 27a, 25a and 29a or the third regions 23c, 27c, 25c and 29c illustrated in FIG. 2. The gate electrode 19 forms the Schottky junction 34b with the barrier layer 29.

With reference to part (a) of FIG. 4, the energy diagram of the channel portion is illustrated. In the second region 25b of the channel layer 25 just below the gate electrode 19, when the voltage Vg applied to the gate electrode 19 is zero, the energy band in the channel layer increases from the barrier layer 27 toward the gate electrode 19 due to the piezoelectric field, but the piezoelectric field is not so large that the bottom of the conduction is below the Fermi level. Hence, two-dimensional electron gas is not induced in the channel layer 25 along the heterojunctions 33 and 35. Accordingly, at zero voltages Vg applied on the gate electrode 19, the transistor 11 is turned off.

With reference to part (b) of FIG. 4, the energy diagram of the channel portion in which a non-zero magnitude of a gate voltage applied thereto is shown. The application of the non-zero voltage $V_T$ on the gate electrode 19 induces a two-dimensional electron gas, 2DEG2, in a hetero-interface 35 in response to the magnitude of the electric field component defined at the interface. In the heterojunction 33 of the second region 25b of the channel layer 25 below the gate electrode 19, a two-dimensional electron gas, 2DEG1, is induced in the channel layer 25 in response to a potential change ($q \times V_T$) caused by the gate voltage. The transistor 11b turns on at the threshold voltage $V_T$. Accordingly, the double-channel transistor 11b exhibits normally-off characteristics.

Figure 5:
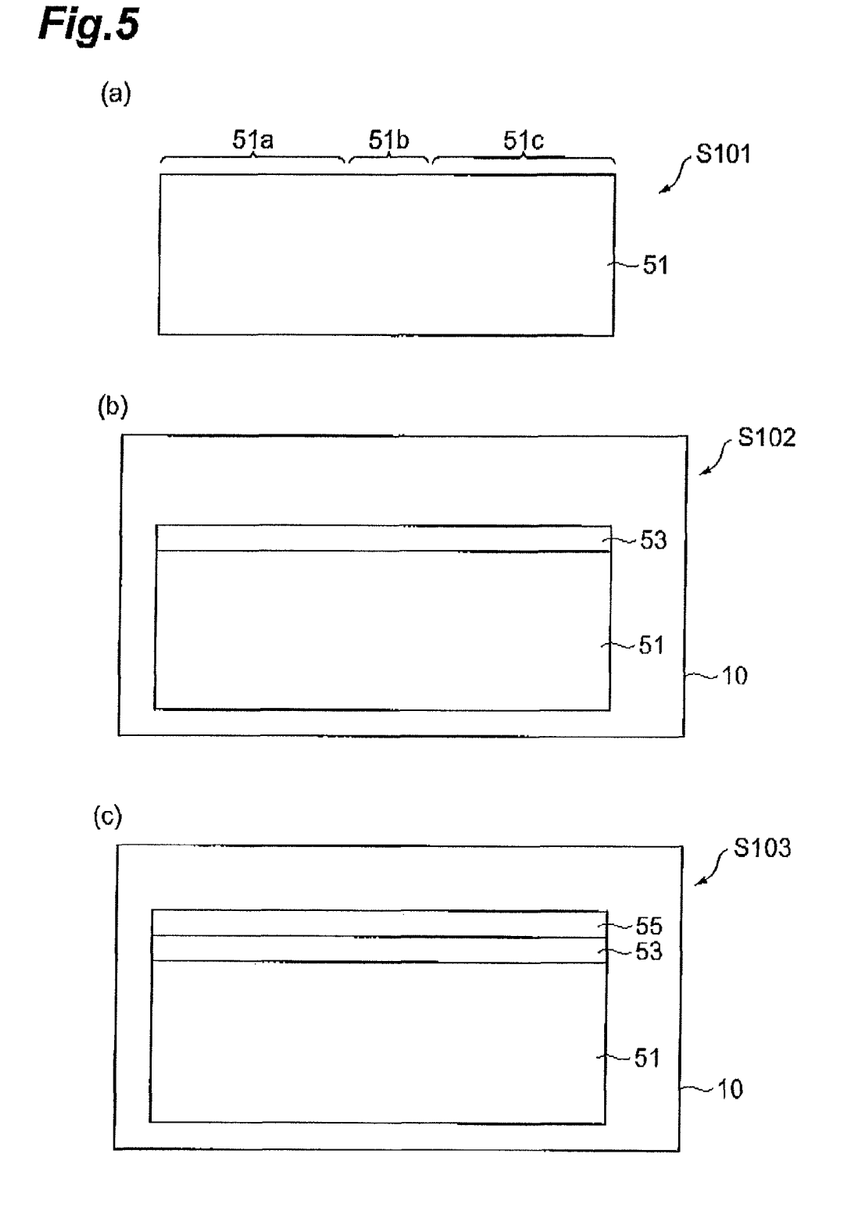
FIG. 5 is a schematic illustration of major steps in a method of fabricating a high electron mobility transistor in accordance with an embodiment.
Figure 6:
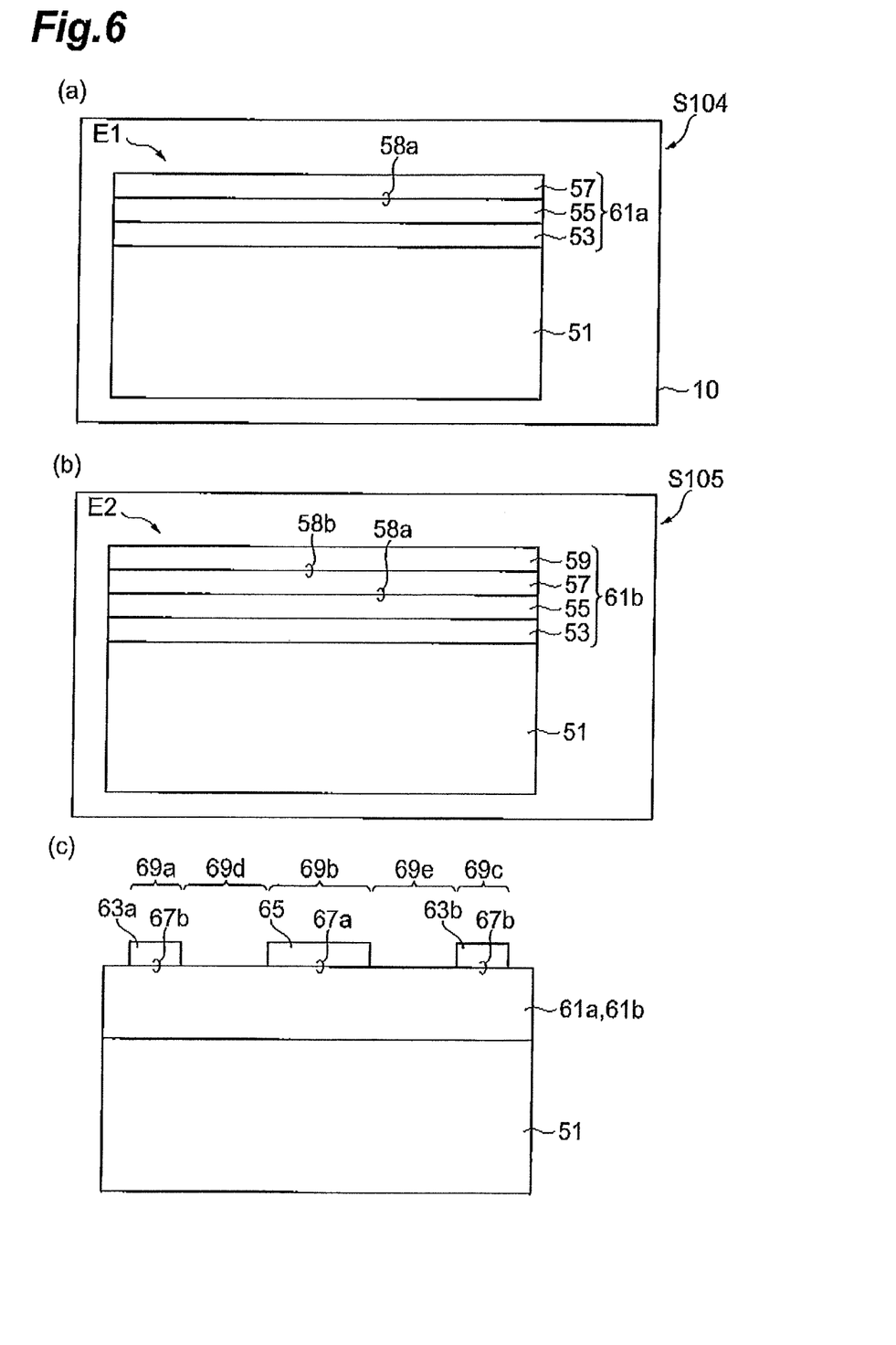
FIG. 6 is a schematic illustration of major steps in a method of fabricating a high electron mobility transistor in accordance with an embodiment.

FIGS. 5 and 6 are schematic illustrations of major steps of a method of fabricating a high electron mobility transistor in accordance with an embodiment. In step S101, a III nitride substrate having a predetermined plane orientation is prepared. The III nitride substrate may comprise, for example, GaN, AlGaN or AlN. The primary surface of the III nitride substrate may have a plane orientation to provide the above flat part. The GaN substrate 51 is used in this embodiment and has the primary surface that is inclined at an angle of 75 degrees toward the m-axis with respect to the c-axis. As illustrated in part (a) of FIG. 5, the GaN substrate 51 has a source region 51a, a drain region 51c and a channel portion 51b.

Subsequently, epitaxial films are grown on the GaN substrate by organic metal vapor phase epitaxy. The GaN substrate 51 is disposed in a growth reactor 10. In step S102, as shown in part (b) of FIG. 5, a buffer layer 53 is grown on the primary surface of the GaN substrate 51. The buffer layer can comprise, for example, undoped GaN.

In step S103, as illustrated in part (c) of FIG. 5, a barrier layer 55 is grown on the primary surface of the GaN substrate 51. The barrier layer 55 may comprise, for example, undoped GaN.

Subsequently, in step S104, as illustrated in part (a) of FIG. 6, a channel layer 57 is grown on the primary surface of the GaN substrate 51. The channel layer 57 can comprise, for example, undoped InGaN. An epitaxial wafer E1 is formed through these steps. The epitaxial wafer E1 includes a semiconductor laminate 61a and a heterojunction 58a. The semiconductor laminate 61a includes semiconductor layers 53, 55 and 57.

An additional barrier layer may be grown on the channel layer 57, if necessary. The process proceeds to step S105 if an additional barrier layer 59 is grown. The epitaxial wafer E1 is taken out from the growth reactor in the fabrication of electron devices.

In step S105, as illustrated in of part (b) of FIG. 6, the barrier layer 59 is grown on the primary surface of the GaN substrate 51. The barrier layer 59 may comprise, for example, undoped GaN. An epitaxial wafer E2 is formed through these steps. The epitaxial wafer E2 includes a semiconductor laminate 61b and heterojunctions 58a and 58b. The semiconductor laminate 61b includes the semiconductor layers 53, 55, 57 and 59.

In the step S106, a source electrode 63a, a drain electrode 63b and a gate electrode 65 are formed as illustrated in part (c) of FIG. 6. The source electrode 63a and the drain electrode 63b are in ohmic contact 67b with the semiconductor laminate 61a or 61b. In this embodiment, a source region 69a, a channel region 69b and a drain region 69c are sequentially arranged along the primary surface of the GaN substrate 51. Furthermore, on the primary surface of the GaN substrate 51, a carrier flow extension 69d is provided between the gate region 69b and the source region 69a, and a carrier flow extension 69e is provided between the gate region 69b and the drain region 69c. By use of an off-angled GaN substrate which provides a negative piezoelectric field an InGaN channel layer incorporating compressive strain, the heterojunction that the InGaN channel layer and the GaN barrier layer form is nearer the primary surface of the substrate. This structure can create two-dimensional gas through the piezoelectric field in the heterojunction so as to provide normally-off characteristics.

In this embodiment, if necessary, semiconductor regions just below the source electrode 61a and the drain electrode 63a may be heavily doped with dopant. If necessary, the barrier layer below the source electrode 61a and the drain electrode 63a may be selectively removed such that the source electrode 61a and the drain electrode 63a are in ohmic contact with the channel layer.

After explaining the estimation of the piezoelectric field, explanation of an example is provided below.

The magnitude of a piezoelectric field induced, for example, in $In_{0.1}Ga_{0.9}N$ is 0.7 MV/cm on a c-plane GaN, and −0.25 MV/cm on a {20-21} plane GaN. The direction of the piezoelectric field on the {20-21} plane InGaN is opposite to that on the c-plane InGaN, and the absolute value of the piezoelectric field in a HEMT structure composed of InGaN/GaN on the {20-21} plane is about ⅓ of the absolute value of the piezoelectric field in InGaN on the c-plane. Meanwhile, in a HEMT structure composed of AlGaN/GaN on the c-plane GaN, the piezoelectric field on $Al_{0.25}Ga_{0.75}N$ is about −2.9 MV/cm. From the above estimation on the magnitude of the piezoelectric field, when the piezoelectric field generates a two-dimensional gas, the magnitude of the piezoelectric field in the HEMT structure on the (20-21) plane is about ⅒ of that in the HEMT structure on the C-plane. Consequently, the bottom of the conduction band of the HEMT structure of the (20-21) plane is not lower than the Fermi level at zero gate bias, in contrast to the HEMT structure of the c-plane. Accordingly, two-dimensional electron gas is not created at zero gate bias.

In the HEMT structure of the (20-21) plane, when a certain amount of forward-bias (positive voltage) is applied to the gate electrode, the dip of the conduction band in the InGaN/GaN heterojunction is bent down below the Fermi level to create a two-dimensional electron gas therein. Thus, this device is an enhanced mode device (normally-off).

Example 1

Figure 7:
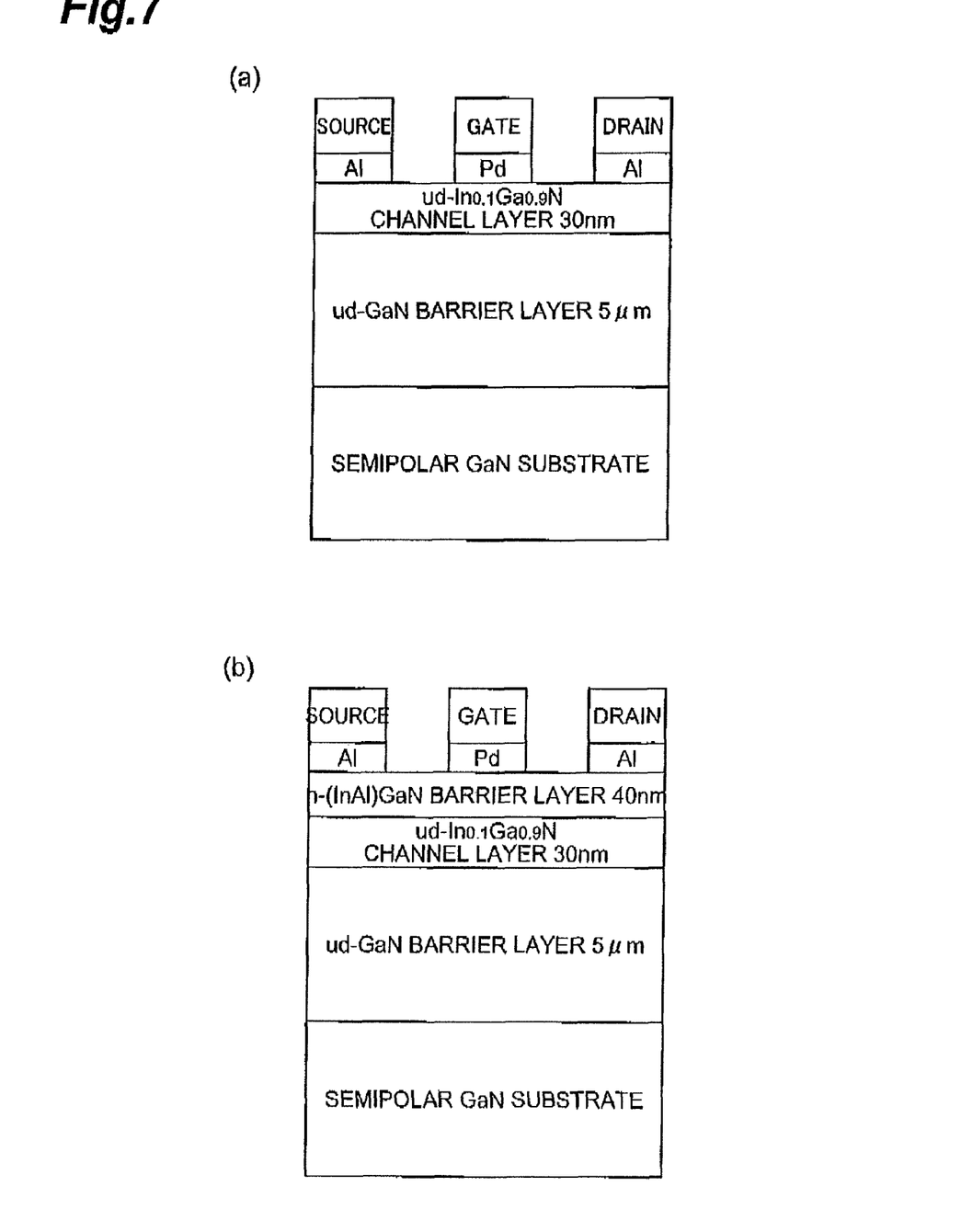
FIG. 7 is a schematic view illustrating HEMT structures in Examples 1 and 2.

Part (a) of FIG. 7 illustrates the structure of a device in Example 1. A HEMT structure illustrated in part (a) of FIG. 7 is formed on the semi-insulating, semipolar GaN substrate (which corresponds to the (20-21) plane) that is inclined at an angle of 75 degrees toward m-axis with respect to the c-axis. In the GaN substrate having conductivity, prior to growing an undoped (ud) GaN layer, an insulating AlN film or a Mg-doped GaN layer is preferably provided between the GaN substrate and the undoped GaN to avoid current leakage to the GaN.

Epitaxial films are grown by organic metal vapor phase epitaxy. A GaN substrate is heat-treated as a pretreatment (thermal cleaning) in an atmosphere of ammonia and hydrogen at 1050 Celsius degrees under a reactor pressure of 27 kPa for 10 minutes. An undoped GaN layer (5 μm thick) is then grown at 1050 Celsius degrees and an $In_{0.1}Ga_{0.9}N$ channel layer (30 μm thick) is grown at a substrate temperature of 780 Celsius degrees. An epitaxial wafer is prepared through these steps. Subsequently, an ohmic electrode for source and drain is formed through lithography, vapor deposition, and a lift-off process. Aluminum (Al) is used as a material for the ohmic electrode. Other materials applicable to the ohmic electrode are for example, titanium (Ti), Ti/Al, silver (Ag) and tungsten (W).

Subsequently, a gate electrode is formed through lithography, vapor deposition and a lift-off process. Palladium (Pd) is used as a material for the gate electrode. Other materials applicable to the gate electrode are, for example, nickel (Ni), Ni/Au, gold (Au) and platinum (Pt).

The HEMT device is completed through these processes. The measurements of static characteristics show that the HEMT device has a threshold voltage of 3 volts and normally-off characteristics.

The inventors have discovered that the threshold voltage can be controlled by the composition and the thickness of the InGaN channel layer. Specifically, with an increase of the indium composition and/or an increase of the thickness of the InGaN layer, the strain in the InGaN layer increases. This leads to an increase of the piezoelectric field in the InGaN layer, resulting in providing a lowered threshold voltage. This threshold voltage has a value below zero volts at an increased piezoelectric field, and this results in so-called a depression mode, or normally-on device. The upper limit of the indium composition and thickness of the InGaN channel layer can be a value at which internal strain is increased to cause crystal defects therein. A channel layer with a low indium composition can be made thick whereas a channel layer with a high indium composition must be made thin. The lower limit of the thickness of the channel layer is not less than about 10 nm because the channel layer may have the thickness that is greater than or equal to the thickness of the two-dimensional electron gas layer. Accordingly, the composition of indium in the channel layer ranges from 0.02 to 0.3, and the thickness of the channel layer ranges from 10 nm to 300 nm.

In order to reduce the source and drain resistance, GaN or InGaN doped to have an n-type may be formed beneath the source and drain electrodes. The concentration of n-type carriers may be preferably in the range of about $0.1×10^{18}$ cm$^{-3}$ to $1×10^{18}$ cm$^{-3}$ to reduce the resistance of the ohmic contact.

The undoped GaN barrier layer may be replaced with a barrier layer of material having a band gap greater than that of the channel layer. For example, an undoped AlGaN layer can be used for the barrier layer. When the barrier layer comprises an undoped AlGaN layer, this barrier layer induces a piezoelectric field which is oriented in the direction from the heterojunction toward the GaN substrate, thus resulting in increase in concentration of the two-dimensional gas in the heterojunction. In this case, the normally-off operation can be maintained by reduction in indium composition of the InGaN channel layer and/or reduction in thickness of the InGaN layer, which are used to control the threshold. A significantly high Al composition in the AlGaN layer makes strain therein high to produce defects in the InGaN layer. The upper limit of the Al composition may be about 5%, although it depends on the thickness of the AlGaN barrier layer.

The barrier layer may comprises an InAlGaN layer. When the InAlGaN layer has a composition which is lattice-matched to GaN, no defect is produced thereby in the InAlGaN layer. A preferable composition of the barrier layer may be, for example, $In_{0.03}Al_{0.14}Ga_{0.83}N$. This barrier layer has a band gap (about 3.49 eV), which is greater than that of GaN. Hence, leak current can be suppressed even if the substrate is conductive. An allowable degree of in-plane lattice mismatch in the heterojunction is in the range of about −1.5% to +1.5%. On a semipolar or non-polar surface, such as the (20-21) plane and the m-plane, which tilts at a large angle with respect to c-plane GaN, both the a-axis and c-axis are completely or approximately parallel to the primary surface. Accordingly, the degrees of the lattice matching of these axes (a- and c-axis) are important.

Example 2

Part (b) of FIG. 7 illustrates a device structure in Example 2. A HEMT structure is prepared and has an n-type GaN layer disposed on the epitaxial laminate structure of Example 1. This additional n-type GaN layer has no internal strain, and creates no piezoelectric field. In this heterojunction formed by the InGaN channel layer and n-type GaN layer, two-dimensional electron gas from a piezoelectric field is not produced. But, since the n-type GaN layer is doped with an n-type dopant, electrons diffuse from n-type GaN into the InGaN channel layer that is not intentionally doped. When the gate voltage is zero volts, two-dimensional electron gas is not generated because of the slope of the conduction band that is caused by the piezoelectric field in the InGaN layer. On the other hand, when the gate electrode is forward-biased, the two-dimensional electron gas channel is created in the heterojunction that n-type GaN layer and InGaN channel layer form, and this heterojunction is nearer the top surface of the device. This results in providing a normally-on operation device.

A HEMT structure illustrated in part (a) of FIG. 7 is fabricated on the semi-insulating, semipolar GaN substrate (corresponding to the (20-21) plane) that is inclined at an angle of 75 degrees towards the m-axis with respect to the c-axis. Since a GaN substrate is conductive, leakage current to the GaN is likely to occur. Hence, prior to the growth of an undoped (ud) GaN layer, an insulating AlN layer or a Mg-doped GaN layer is preferably grown between the GaN substrate and the undoped GaN.

Epitaxial films are grown by organic metal vapor phase epitaxy. A GaN substrate is heat-treated as a pretreatment (thermal cleaning) in an atmosphere of ammonia and hydrogen at 1050 Celsius degrees under a reactor pressure of 27 kPa for 10 minutes. An undoped GaN layer (5 µm thick) is then grown thereon at 1050 Celsius degrees, and, after the substrate temperature is lowered to 780 Celsius degrees, an $In_{0.1}Ga_{0.9}N$ channel layer (30 µm thick) is grown thereon. The substrate temperature is raised to 1050 Celsius degrees and set thereat again to grow a Si-doped GaN layer (40 nm thick). Its Si concentration is $2 \times 10^{17}$ cm$^{-3}$. The epitaxial wafer is fabricated through these steps. Subsequently, an ohmic electrode for source and drain is formed through lithography, vapor deposition and a lift-off process. Aluminum (Al) is used as material for the ohmic electrode. Other materials applicable to the ohmic electrode are titanium (Ti), Ti/Al, silver (Ag) and tungsten (W).

Subsequently, the gate electrode is prepared through lithography, vapor deposition and a lift-off process. Palladium (Pd) is used as material for the gate electrode. Other materials applicable to the gate electrode are nickel (Ni), Ni/Au, gold (Au), and platinum (Pt).

A dual-channel HEMT structure is completed by these processes. The measurements of static characteristics show that the HEMT device has a threshold voltage of 3 volts and, therefore, demonstrates normally-off characteristics.

Referring to the explanation in Example 1, the transistor has a dual-channel HEMT structure having two-dimensional gas created in the two interfaces of the undoped InGaN channel layer. The channel has a dual structure, which provides a significantly large maximum saturation current (Idmax), so that a device suitable for high current applications is provided.

In addition to control of the composition and the thickness of the InGaN channel layer (control of the lower channel) as in Example 1, the threshold voltage is controlled by the dopant concentration and/or thickness of the n-type GaN barrier layer (control of the upper channel). The pinch-off voltage at a gate voltage of zero is proportional to the dopant concentration of the upper barrier layer, and is also proportional to the square of its thickness. The threshold voltage increases as the pinch-off voltage decreases. Accordingly, a decreased doping concentration and decreased thickness of the upper barrier layer increase the threshold, so that the HEMT structure exhibits normally-off characteristics.

In order to reduce the source and drain resistance, the GaN or InGaN layer that is doped to have an n-type conductivity may be disposed beneath the source and drain electrodes. The concentration of n-type carriers is preferably in the range of about $0.1 \times 10^{18}$ cm$^{-3}$ to $1 \times 10^{18}$ cm$^{-3}$. This range can reduce the resistance of the ohmic contact.

The upper n-type GaN barrier layer may be made of material having a band gap greater than that of the channel layer. For example, an n-type InAlGaN layer may be preferably used therefore. When a InAlGaN layer has a composition which is lattice-matched to GaN, no defect occurs in the InAlGaN layer. For example, an n-type $In_{0.03}Al_{0.14}Ga_{0.83}N$ layer may be preferably used therefore. The $In_{0.03}Al_{0.14}Ga_{0.83}N$ layer has a band gap of about 3.4 eV, which is greater than that of GaN, so that the band discontinuity between the conduction bands of the InGaN channel layer and n-type InAlGaN layer increases, enhancing the concentration of the two-dimension electron gas.

As described above, the embodiments provide a high electron mobility transistor that exhibits normally-off characteristics. Further, the embodiments provide an epitaxial wafer for this high electron mobility transistor. Furthermore, the embodiments provide a method of fabricating this high electron mobility transistor.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A high electron mobility transistor comprising:
   a free-standing supporting base having a III nitride region;
   a first III nitride barrier layer on the III nitride region;
   a III nitride channel layer on the first III nitride barrier layer, the III nitride channel layer forming a first heterojunction with the first III nitride barrier layer;

a gate electrode provided on the III nitride channel layer so as to exert an electric field on the first heterojunction;
a source electrode provided on the III nitride channel layer and the first III nitride barrier layer; and
a drain electrode provided on the III nitride channel layer and the first III nitride barrier,
the III nitride channel layer having compressive internal strain such that a piezoelectric field in the III nitride channel layer is oriented in a direction from the supporting base toward the first III nitride barrier layer, and
the first heterojunction extending along a plane, a normal axis of the plane being inclined at an inclination angle in a range of 40 degrees to 85 degrees or 140 degrees to 180 degrees with respect to a c-axis of the III nitride region.

2. The high electron mobility transistor according to claim 1, wherein the supporting base comprises group III nitride.

3. The high electron mobility transistor according to claim 1, wherein a band gap of the first III nitride barrier layer is larger than that of the III nitride channel layer,
the first III nitride barrier layer applies compressive stress to the III nitride channel layer,
material of the III nitride channel layer comprises $In_XGa_{1-X}N$ ($0<X\leq1$), and
material of the first III nitride barrier layer comprises $In_YAl_ZGa_{1-Y-Z}N$ ($0\leq Y<1$, $0\leq Z\leq1$, $0\leq Y+Z\leq1$).

4. The high electron mobility transistor according to claim 1, wherein a primary surface of the supporting base extends along a plane having a normal axis that is inclined at an inclination angle in a range of 40 degrees to 85 degrees or 140 degrees to 180 degrees with respect to a c-axis of the III nitride region.

5. The high electron mobility transistor according to claim 1, wherein the supporting base is composed of GaN.

6. The high electron mobility transistor according to claim 1, wherein an inclination angle of the first heterojunction is in a range of 50 degrees to 80 degrees.

7. The high electron mobility transistor according to claim 1, wherein an inclination angle of the first heterojunction is in a range of 145 degrees to 170 degrees.

8. The high electron mobility transistor according to claim 1, further comprising an undoped GaN buffer layer, the undoped GaN buffer layer being provided between the supporting base and the first III nitride barrier layer.

9. The high electron mobility transistor according to claim 1, wherein the supporting base is semi-insulating.

10. The high electron mobility transistor according to claim 1, wherein the supporting base is conductive.

11. The high electron mobility transistor according to claim 1, further comprising an $Al_WGa_{1-W}N$ ($0<W\leq1$) layer provided between the III nitride channel layer and the supporting base.

12. The high electron mobility transistor according to claim 1, wherein the gate electrode forms a Schottky junction with the III nitride channel layer.

13. The high electron mobility transistor according to claim 1, wherein the III nitride channel layer comprises a material containing indium as a group III constituent element, and an inclination angle of the first heterojunction is in a range of 63 degrees to 80 degrees.

14. The high electron mobility transistor according to claim 13, wherein an inclination angle of the first heterojunction is in a range of 70 degrees to 80 degrees.

15. The high electron mobility transistor according to claim 1, further comprising a second III nitride barrier layer provided between the gate electrode and the III nitride channel layer,
wherein the second III nitride barrier layer forms a second heterojunction with the III nitride channel layer, and
wherein the second heterojunction extends along a plane, the plane has a normal axis inclined at an inclination angle in a range of 40 degrees to 85 degrees or 140 degrees to 180 degrees with respect to a c-axis of the III nitride region.

16. The high electron mobility transistor according to claim 15, wherein the second III nitride barrier layer is doped with n-type dopant.

17. The high electron mobility transistor according to claim 1, further comprising a GaN buffer layer, the GaN buffer layer being provided between the supporting base and the first III nitride barrier layer,
wherein the buffer layer contains n-type and p-type impurities,
a concentration of the p-type impurity is not less than $1\times10^{17}$ cm$^{-3}$, and
a concentration of the n-type impurity is not less than $1\times10^{17}$ cm$^{-3}$.

18. The high electron mobility transistor according to claim 17, wherein the n-type impurity comprises oxygen.

19. The high electron mobility transistor according to claim 17, wherein the p-type impurity comprises at least one of carbon, magnesium, and zinc.

20. An epitaxial substrate for a high electron mobility transistor, the epitaxial substrate comprising:
a free-standing substrate having a III nitride region;
a first III nitride barrier layer provided on the III nitride region; and
a III nitride channel layer provided on the first III nitride barrier layer,
a first surface of the III nitride channel layer forming a first heterojunction with the first III nitride barrier layer,
the III nitride channel layer including compressive internal strain such that a piezoelectric field of the III nitride channel layer is oriented in a direction the substrate towards the first III nitride barrier layer,
a primary surface of the supporting base extending along a plane, the plane having a normal axis inclined at an inclination angle in a range of 40 degrees to 85 degrees or 140 degrees to 180 degrees with respect to a c-axis of the first III nitride barrier layer,
the first heterojunction extending along a plane, the plane having a normal axis inclined at an inclination angle in a range of 40 degrees to 85 degrees or 140 degrees to 180 degrees with respect to a c-axis of the III nitride region,
a second surface of the III nitride channel layer extending along a plane, the plane having a normal axis inclined at an inclination angle in a range of 40 degrees to 85 degrees or 140 degrees to 180 degrees with respect to a c-axis of the first III nitride barrier layer, and
the second surface of the III nitride channel layer being opposite to the first surface of the III nitride channel layer.

21. The epitaxial substrate according to claim 20, further comprising a second III nitride barrier layer, the second III nitride barrier layer forming the second heterojunction on the second plane of the III nitride channel layer,
wherein the second III nitride barrier layer is provided on the III nitride channel layer,
wherein the second III nitride barrier layer forms the second heterojunction with the III nitride channel layer,
wherein the second heterojunction of the III nitride channel layer extends along a plane, the plane has a normal axis inclined at an inclination angle in a range of 40 degrees to 85 degrees or 140 degrees to 180 degrees with respect to a c-axis of the first III nitride barrier layer.

22. The epitaxial substrate according to claim 21, wherein the second nitride barrier layer includes compressive internal strain such that a piezoelectric field of the second nitride barrier layer is oriented in a direction from the substrate towards the first III nitride barrier layer.

23. A method of fabricating a high electron mobility transistor, the method comprising the steps of:
preparing a free-standing substrate, the free-standing substrate including a III nitride region;
growing a first III nitride barrier layer on the III nitride region;
growing a III nitride channel layer on the first III nitride barrier layer; and
forming a gate electrode on the III nitride channel layer, the gate electrode being configured to exert an electric field on the first heterojunction,
the III nitride channel layer including compressive internal strain such that a piezoelectric field in the III nitride channel layer is oriented in a direction from the supporting base towards the first III nitride barrier layer,
the III nitride channel layer forming a first heterojunction with the first III nitride barrier layer,
a primary surface of the substrate extending along a plane, the plane having a normal axis inclined at an inclination angle in a range of 40 degrees to 85 degrees or 140 degrees to 180 degrees with respect to a c-axis of the III nitride region, and
the first heterojunction extending along a plane, the plane having a normal axis inclined at an inclination angle in a range of 40 degrees to 85 degrees or 140 degrees to 180 degrees with respect to the c-axis of the III nitride region.

24. The method according to claim 23, the method further comprising the step of growing a second III nitride barrier layer, the second III nitride barrier layer forming a second heterojunction with the second surface of the III nitride channel layer,
wherein the second III nitride barrier layer is provided on the III nitride channel layer,
wherein the second III nitride barrier layer forms the second heterojunction with the III nitride channel layer, and
wherein the second heterojunction extends along a plane having a normal axis inclined at an inclination angle in a range of 40 degrees to 85 degrees or 140 degrees to 180 degrees with respect to a c-axis of the III nitride region.

25. The method according to claim 24, wherein a band gap of the second III nitride barrier layer is smaller than that of the first III nitride barrier layer.

26. The method according to claim 24, wherein material of the second III nitride barrier layer has an intrinsic lattice constant smaller than that of material of the first III nitride barrier layer.

* * * * *